(12) United States Patent
Takeshima

(10) Patent No.: US 11,639,979 B2
(45) Date of Patent: May 2, 2023

(54) MAGNETIC RESONANCE IMAGING APPARATUS, MAGNETIC RESONANCE IMAGING METHOD, AND COMPUTER PROGRAM PRODUCT

(71) Applicant: CANON MEDICAL SYSTEMS CORPORATION, Otawara (JP)

(72) Inventor: Hidenori Takeshima, Kawasaki (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 0 days.

(21) Appl. No.: 17/412,540

(22) Filed: Aug. 26, 2021

(65) Prior Publication Data

US 2022/0065964 A1 Mar. 3, 2022

(30) Foreign Application Priority Data

Aug. 26, 2020 (JP) .............................. JP2020-142528

(51) Int. Cl.
*G01V 3/00* (2006.01)
*G01R 33/54* (2006.01)
*G01R 33/561* (2006.01)
*G01R 33/563* (2006.01)
*G01R 33/56* (2006.01)

(52) U.S. Cl.
CPC ......... *G01R 33/543* (2013.01); *G01R 33/563* (2013.01); *G01R 33/5608* (2013.01); *G01R 33/5611* (2013.01)

(58) Field of Classification Search
CPC .............. G01R 33/3415; G01R 33/543; G01R 33/5659; G01R 33/36; A61B 5/055
USPC ....................................................... 324/309
See application file for complete search history.

(56) References Cited

U.S. PATENT DOCUMENTS

| 2006/0064004 | A1 | 3/2006 | Machida |
| 2013/0072783 | A1* | 3/2013 | Hyde .................... A61B 6/5241 600/424 |
| 2013/0085715 | A1* | 4/2013 | Lakshminarayan ........................ G06K 9/00536 702/179 |

(Continued)

FOREIGN PATENT DOCUMENTS

| JP | 2006-116299 A | 5/2006 |
| WO | WO-2014031754 A2 * | 2/2014 ............. A61B 5/004 |

(Continued)

OTHER PUBLICATIONS

Wang, D. et al. "Spiral Time of Flight with Partial Fourier Slice Selection and Sliding-slice Local Quadratic Encoding" ISMRM Workshop on Data Sampling & Image Reconstruction section 4, 20:50 (2020), 1 page.

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

A magnetic resonance imaging apparatus according to an embodiment includes sequence control circuitry and processing circuitry. The sequence control circuitry performs multi-frame acquisition where FOVs (Field Of Views) of at least two acquired frames are overlapped in a first direction. Then, based on the multi-frame acquisition performed by the sequence control unit, the processing unit generates data regarding the components in the first direction of flow of a fluid.

9 Claims, 4 Drawing Sheets

(56) References Cited

U.S. PATENT DOCUMENTS

2013/0343625 A1* 12/2013 Samsonov ......... G01R 33/5611
382/131
2017/0322274 A1* 11/2017 Bolster, Jr. ......... G01R 33/5615

FOREIGN PATENT DOCUMENTS

WO    WO-2015136534 A1 *   9/2015   .......... A61B 8/0883
WO    WO-2016061502 A1 *   4/2016   .......... A61B 5/0042

* cited by examiner

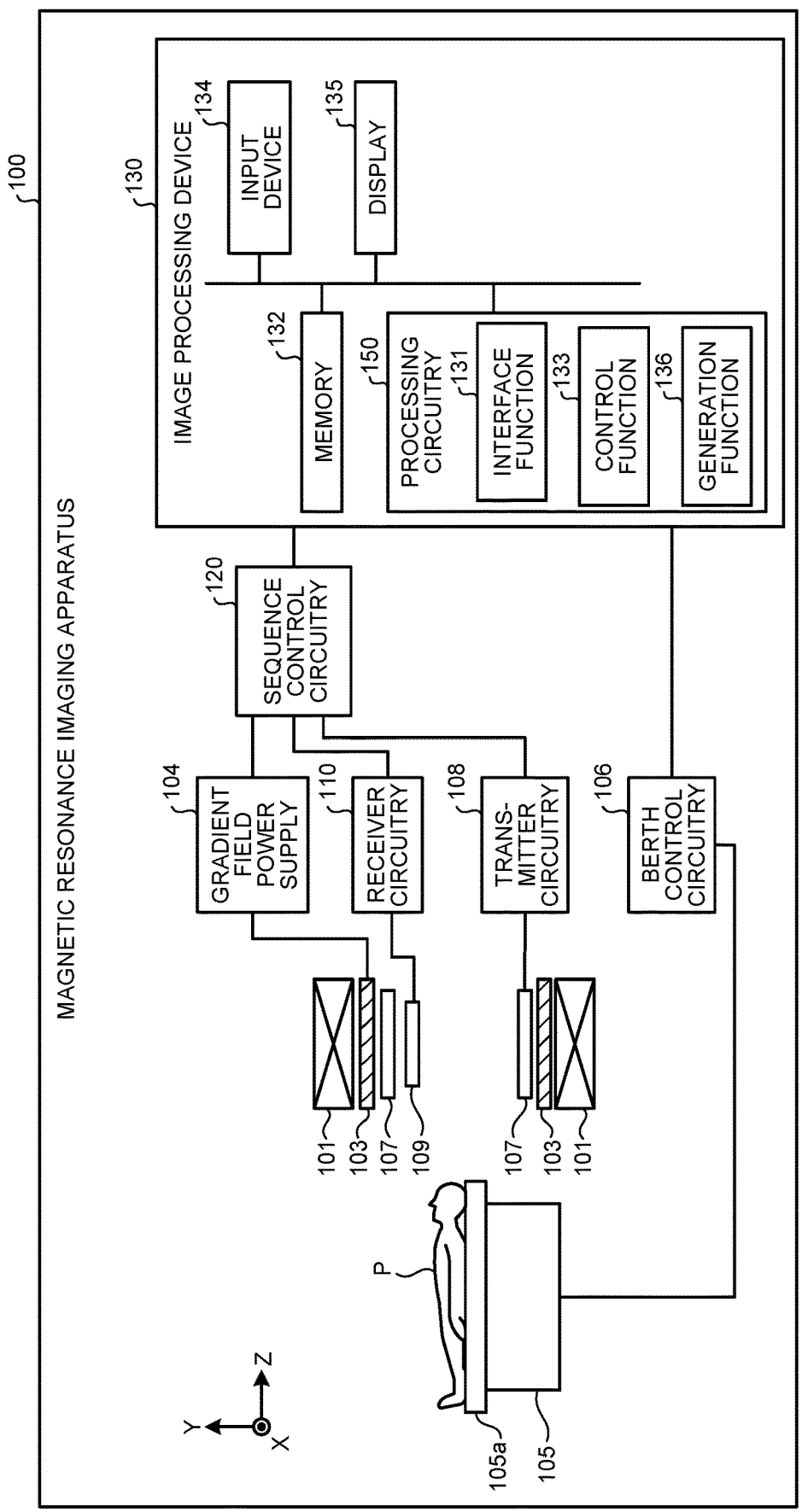

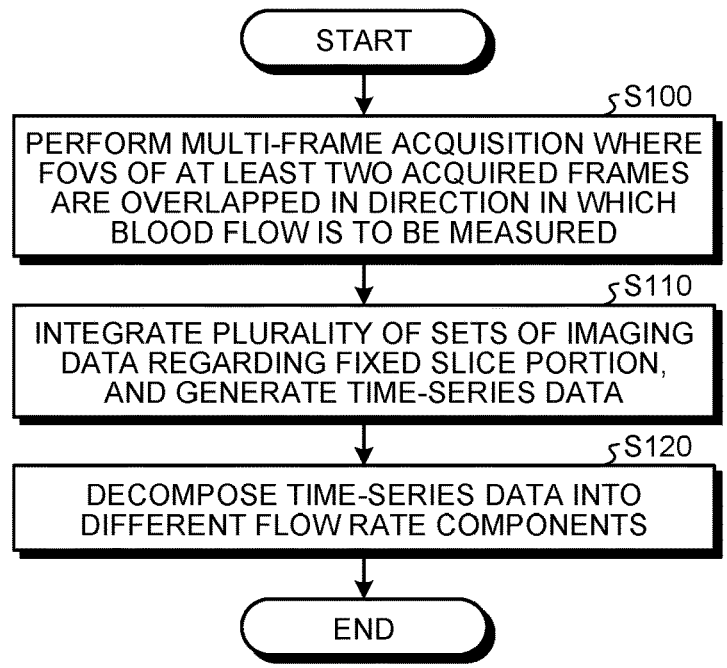
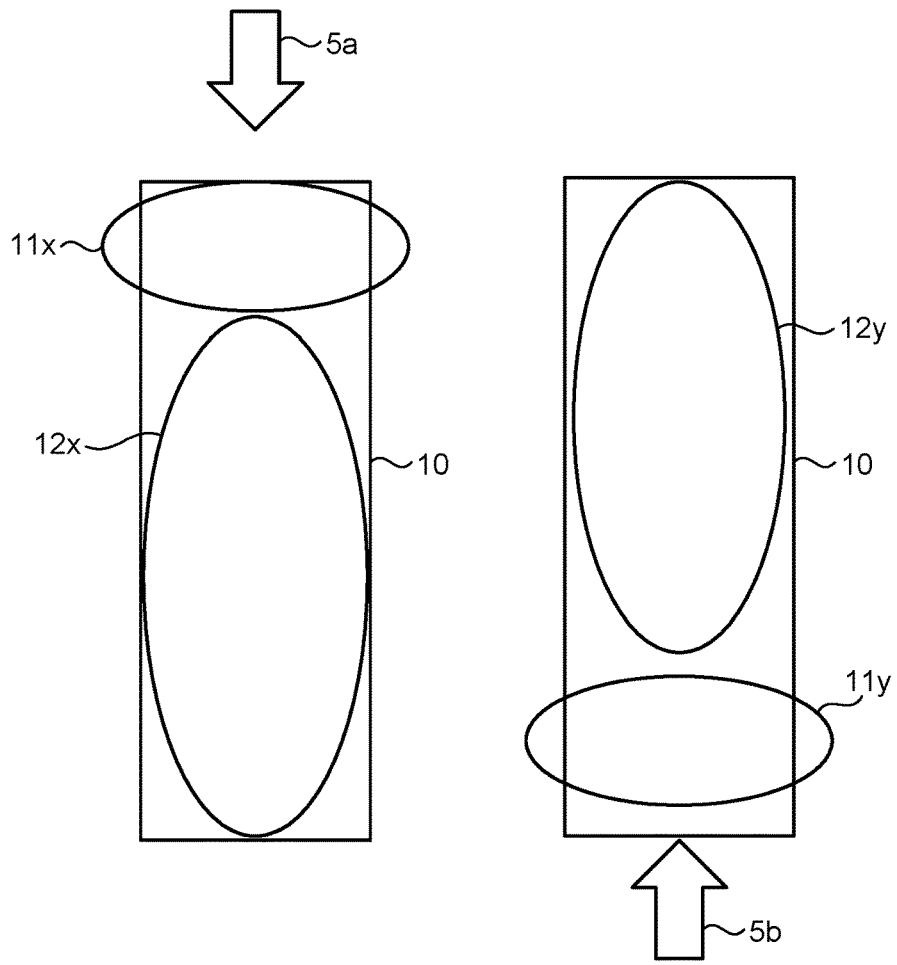

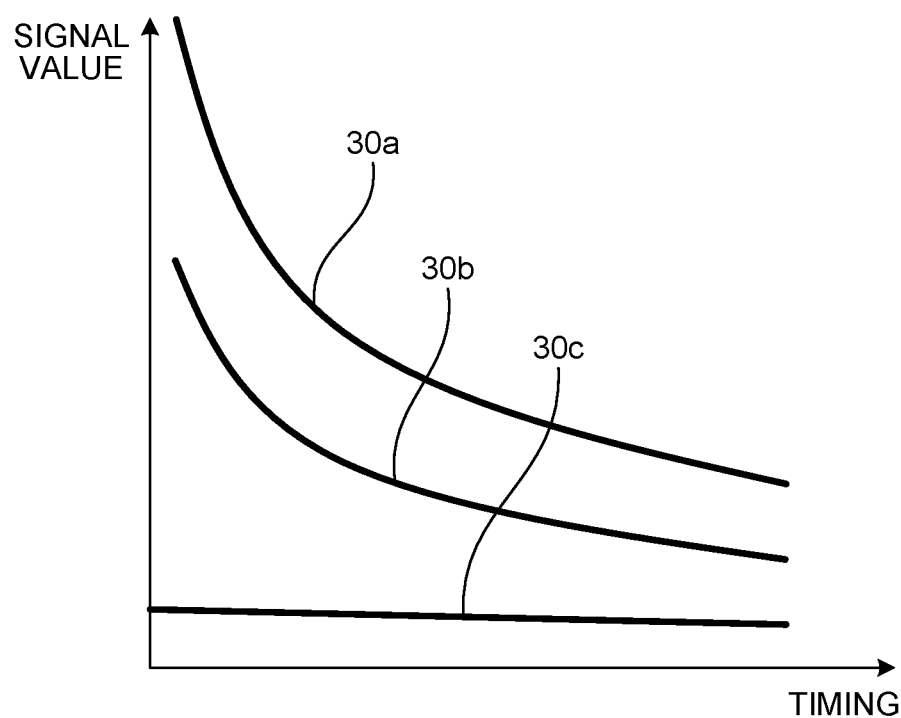

MAGNETIC RESONANCE IMAGING APPARATUS, MAGNETIC RESONANCE IMAGING METHOD, AND COMPUTER PROGRAM PRODUCT

CROSS-REFERENCE TO RELATED APPLICATIONS

This application is based upon and claims the benefit of priority from Japanese Patent Application No. 2020-142528, filed on Aug. 26, 2020; the entire contents of which are incorporated herein by reference.

FIELD

Embodiments described herein relate generally to a magnetic resonance imaging apparatus, a magnetic resonance imaging method, and a computer program product.

BACKGROUND

As a method of visualizing the blood vessels, a method is known in which imaging is performed with the use of a contrast agent. Moreover, a method is also known in which imaging is performed at different timings using an electrocardiogram (ECG), and the data obtained as a result of Performing imaging at the different timings is differentiated, so that the blood vessels are visualized.

However, the method of performing imaging using a contrast agent is invasive in nature. Moreover, the method of performing imaging using an ECG not only requires the use of an ECG, but also requires breath holding in the case of taking images of a moving organ.

Hence, it is desirable that a method is developed to enable taking images of a moving organ without having to use a contrast agent, or without having to use special hardware, or without having to do breath holding. Moreover, it is also desirable that a method is developed to enable obtaining the flow rate.

BRIEF DESCRIPTION OF THE DRAWINGS

FIG. 1 is a block diagram of a magnetic resonance imaging apparatus according to an embodiment;
FIG. 2 is a flowchart for explaining the flow of operations performed in the magnetic resonance imaging apparatus according to the embodiment; and
FIG. 3A to 5 are diagrams for explaining the operations performed in the magnetic resonance imaging apparatus according to the embodiment.

DETAILED DESCRIPTION

Figure 4:
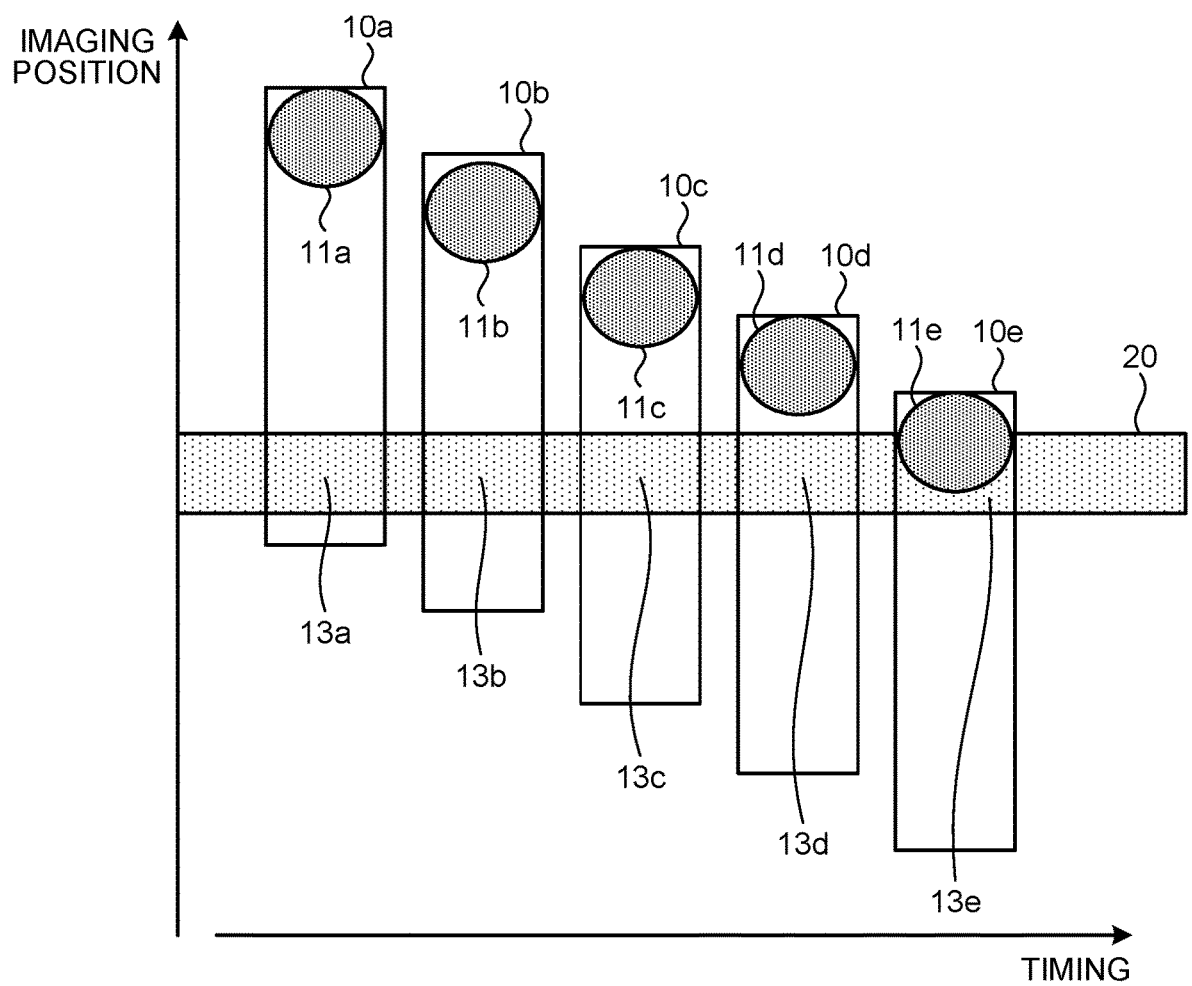

A magnetic resonance imaging apparatus according to an embodiment includes sequence control circuitry and processing circuitry. The sequence control circuitry performs multi-frame acquisition where FOVs (Field Of Views) of at least two acquired frames are overlapped in a first direction. Then, based on the multi-frame acquisition performed by the sequence control circuitry, the processing circuitry generates data regarding the components in the first direction of flow of a fluid.

The embodiment of the magnetic resonance imaging apparatus, a magnetic resonance imaging method, and a computer program product is described below in detail with reference to the accompanying drawings.

First Embodiment

FIG. 1 is a block diagram of a magnetic resonance imaging apparatus 100 according to a first embodiment. As illustrated in FIG. 1, the magnetic resonance imaging apparatus 100 includes a static magnetic field magnet 101, a static magnetic field power supply (not illustrated), a gradient coil 103, a gradient field power supply 104, a berth 105, berth control circuitry 106, a transmitter coil 107, transmitter circuitry 108, a receiver coil 109, receiver circuitry 110, sequence control circuitry 120 (a sequence control unit), and an image processing device 130. Further, a subject P (for example, a human being) is not a part of the magnetic resonance imaging apparatus 100. Moreover, the configuration illustrated in FIG. 1 is only exemplary. For example, the constituent elements of the sequence control circuitry 120 and the image processing device 130 can be appropriately integrated or separated.

The static magnetic field magnet 101 is a hollow magnet having a substantially cylindrical shape, and generates a static magnetic field in its internal space. The static magnetic field magnet 101 is, for example, a superconducting magnet that receives the supply of an electric current from the static magnetic field power supply and becomes energized. Thus, the static magnetic field power supply supplies an electric current to the static magnetic field magnet 101. As another example, the static magnetic field magnet 101 can be a permanent magnet. In that case, the magnetic resonance imaging apparatus 100 need not include the static magnetic field power supply. Further, it is also possible to have the static magnetic field power supply installed separately from the magnetic resonance imaging apparatus 100.

The gradient coil 103 is a hollow coil having a substantially cylindrical shape, and is disposed on the inside of the static magnetic field magnet 101. The gradient coil 103 is formed by combining three coils corresponding to the X, Y, and Z axes that are mutually orthogonal; and those three coils individually receive the supply of an electric current from the gradient field power supply 104 and generate gradient fields in which the magnetic field intensity changes along the X, Y, and Z axes, respectively. The gradient fields generated along the X, Y, and Z axes by the gradient coil 103 are, for example, a slice gradient field Gs, a phase encoding gradient field Ge, and a lead-out gradient field Gr. The gradient field power supply 104 supplies an electric current to the gradient coil 103.

The berth 105 includes a top panel 105a on which the subject P is asked to lie down. Under the control of the berth control circuitry 106, the berth 105 having the subject P lying down on it is inserted in the hollow portion (the imaging opening) of the gradient coil 103. Usually, the berth 105 is installed in such a way that the longitudinal direction thereof is parallel to the central axis of the static magnetic field magnet 101. Under the control of the image processing device 130, the berth control circuitry 106 drives the berth 105 and moves the top panel 105a in the longitudinal direction and in the vertical direction.

The transmitter coil 107 is disposed on the inside of the gradient coil 103. The transmitter coil 107 receives the supply of RF pulses from the transmitter circuitry 108, and generates a high-frequency magnetic field. Herein, to the transmitter coil 107, the transmitter circuitry 108 supplies RF pulses corresponding to the Larmor frequency that is decided according to the type of the target atoms and the magnetic field intensity.

The receiver coil 109 is disposed on the inside of the gradient coil 103, and receives magnetic resonance signals (hereinafter, called "MR signals" as necessary) coming from the subject P due to the application of the high-frequency magnetic field. Upon receiving the magnetic resonance signals, the receiver coil 109 outputs them to the receiver circuitry 110.

Further, the transmitter coil 107 and the receiver coil 109 explained above are only exemplary. Alternatively, they can be configured using some combination of a coil equipped with only the transmission function, a coil equipped with only the reception function, and a coil equipped with the transmission-reception function.

The receiver circuitry 110 detects the magnetic resonance signals output from the receiver coil 109, and generates magnetic resonance data based on the detected magnetic resonance signals. More particularly, the receiver circuitry 110 generates magnetic resonance data by converting the magnetic resonance signals, which are output from the receiver coil 109, into the digital form. Then, the receiver circuitry 110 sends the magnetic resonance data to the sequence control circuitry 120. Further, the receiver circuitry 110 can be installed in a mount device that includes the static magnetic field magnet 101 and the gradient coil 103.

The sequence control circuitry 120 takes images of the subject P by driving the gradient field power supply 104, the transmitter circuitry 108, and the receiver circuitry 110 based on sequence information sent by the image processing device 130. The sequence information represents information in which the sequence of imaging is defined. In the sequence information, the following is defined: the intensity and the supply timing of the electric current to be supplied from the gradient field power supply 104 to the gradient coil 103; the intensity and the application timing of the RF pulses to be supplied from the transmitter circuitry 108 to the transmitter coil 107; and the timing of detection of the magnetic resonance signals by the receiver circuitry 110. Herein, the sequence control circuitry 120 is, for example, an integrated circuit such as an application specific integrated circuit (ASIC) or a field programmable gate array (FPGA); or an electronic circuit such as a central processing unit (CPU) or a micro processing unit (MPU). Regarding the pulse sequence implemented by the sequence control circuitry 120, the detailed explanation is given later.

As a result of taking images of the subject P by driving the gradient field power supply 104, the transmitter circuitry 108, and the receiver circuitry 110; when the magnetic resonance data is received from the receiver circuitry 110, the sequence control circuitry 120 transfers the received magnetic resonance data to the image processing device 130. The image processing device 130 performs the overall control of the magnetic resonance imaging apparatus 100 and generates images. The image processing device 130 includes a memory 132, an input device 134, a display 135, and processing circuitry 150. The processing circuitry 150 is equipped with an interface function 131, a control function 133, and a generation function 136.

In the first embodiment, the processing functions implemented as the interface function 131, the control function 133, and the generation function 136 are stored in the form of computer-executable programs in the memory 132. The processing circuitry 150 is a processor that reads a computer program from the memory 132, and executes the computer program so that the corresponding function is implemented. In other words, as a result of reading the computer programs, the processing circuitry 150 gets equipped with the functions as illustrated in FIG. 1. Further, with reference to FIG. 1, the explanation is given for the case in which the processing functions implemented as the interface function 131, the control function 133, and the generation function 136 are implemented by single processing circuitry 150. Alternatively, the processing circuitry 150 can be configured by combining a plurality of independent processors each of which executes computer programs and implements corresponding functions. In other words, each of the abovementioned functions can be configured as a computer program and single processing circuitry 150 can execute all computer programs. As another example, specific functions can be installed in a dedicated and independent program execution circuit. Further, with reference to FIG. 1, the interface function 131, the control function 133, and the generation function 136 represent examples of a control unit, a generating unit, and an analyzing unit, respectively. Moreover, the sequence control circuitry 120 represents an example of a sequence control unit.

In the explanation given above, the term "processor" implies, for example, a central processing unit (CPU); or a graphical processing unit (GPU); or a circuit such as an application specific integrated circuit (ASIC) or a programmable logic device (such as a simple programmable logic device (SPLD), a complex programmable logic device (CPLD), or a field programmable gate array (FPGA)). The processor reads the computer programs stored in the memory 132 and executes them so as to implement the functions.

Further, instead of storing computer programs in the memory 132, they can be directly embedded into the circuit of a processor. In that case, the processor reads the computer programs embedded in the circuit and executes them so as to implement the functions. In the same way, the berth control circuitry 106, the transmitter circuitry 108, and the receiver circuitry 110 are also configured using an electronic circuit such as a processor.

The processing circuitry 150 implements the interface function 131, and sends the sequence information to the sequence control circuitry 120 as well as receives the magnetic resonance data from the sequence control circuitry 120. Moreover, upon receiving the magnetic resonance data, the processing circuitry 150, which is equipped with the interface function 131, stores the magnetic resonance data in the memory 132.

The magnetic resonance data that is stored in the memory 132 is placed in the k-space by the control function 133. As a result, the memory 132 stores k-space data.

The memory 132 is used to store the following: the magnetic resonance data received by the processing circuitry 150 that is equipped with the interface function 131; the k-space data placed in the k-space by the processing circuitry 150 that is equipped with the control function 133; and the image data generated by the processing circuitry 150 that is equipped with the generation function 136. For example, the memory 132 is a semiconductor memory device such as a random access memory (RAM) or a flash memory; or a hard disk; or an optical disk.

The input device 134 receives various instructions and a variety of information from the operator. The input device 134 is, for example, a pointing device such as a mouse or a trackball; or selection devices such as mode switches; or a keyboard. Moreover, under the control of the processing circuitry 150 that is equipped with the control function 133, the display 135 displays a graphical user interface (GUI) meant for receiving input of imaging conditions, and displays images generated by the processing circuitry 150 that is equipped with the generation function 136. The display 135 is, for example, a display device such as a liquid crystal display device.

The processing circuitry 150 implements the control function 133 to perform the overall control of the magnetic resonance imaging apparatus 100, and to control imaging, image generation, and image display. For example, the processing circuitry 150 that is equipped with the control function 133 receives input of the imaging conditions (the imaging parameters) via the GUI, and generates sequence information according the received imaging conditions. Moreover, the processing circuitry 150 that is equipped with the control function 133 sends the generated sequence information to the sequence control circuitry 120.

The processing circuitry 150 implements the generation function 136 so as to read the k-space data from the memory 132, perform reconstruction processing such as Fourier transform with respect to the k-space data, and generate images.

Explained below with reference to FIGS. 2 to 5 is a configuration according to the embodiment.

FIG. 2 is a flowchart for explaining the flow of operations performed in the magnetic resonance imaging apparatus according to the embodiment.

Firstly, at Step S100, the sequence control circuitry 120 performs multi-frame acquisition while overlapping the field of view (FOV) in the direction in which the blood flow is to be measured. In other words, the sequence control circuitry 120 performs multi-frame acquisition while partially having the FOV in common in the direction in which the blood flow is to be measured.

The background for this is explained with reference to FIGS. 3A and 3B. Firstly, the explanation is given for the case in which the sequence control circuitry 120 performs a single-frame acquisition instead of performing multi-frame acquisitions where the FOV of acquisitions is shifted in a frame-by-frame manner.

To begin with, with reference to FIG. 3A, the explanation is given for the case in which the direction of a blood flow 5a is downward from above as illustrated in FIG. 3A. The sequence control circuitry 120 uses a pulse sequence method of the gradient echo type, such as the spoiled gradient recalled echo (SPGR), and performs imaging regarding an FOV 10. The parameters of the implemented pulse sequence typically include a flip angle (FA) in the approximate range from 5° to 10°, and the repetition time (TR) of about 4 milliseconds.

At this time, of the FOV 10, in a region 11x representing the end closer to the upstream side of the blood flow, signals concerning hydrogen atoms that have flown from the outside of the FOV 10 are included in large number. That is, transient signals are included in large number. As a result, as compared to a region 12x that is the remaining region, a high signal strength is obtained in the region 11x. On the other hand, in the region 12x, signals concerning hydrogen atoms originally present within the FOV 10 are the dominant signals. That is, steady signals are the dominant signals. Hence, as compared to the region 11x, the signal strength becomes weaker in the region 12x.

In contrast, consider the case in which the direction of a blood flow 5b is upward from below as illustrated in FIG. 3B. In that case, in a region f1y representing the end closer to the upstream side of the blood flow, signals concerning hydrogen atoms that have flown from the outside of the FOV 10 are included in large number. That is, unsteady signals are included in large number. As a result, as compared to a region 12y that is the remaining region, a high signal strength is obtained in the region 11x. On the other hand, in the region 12y, steady signals are the dominant signals. Hence, as compared to the region 11y, the signal strength becomes weaker in the region 12y.

Further, the difference between the signal strength in the region 11x and the signal strength in the region 12x or the difference between the signal strength in the region 11y and the signal strength in the region 12y increases in proportion to the speed of the blood flow. Thus, as a result of measuring the difference in the signal strengths between the two regions, the processing circuitry 150 becomes able to estimate the magnitude of the blood flow using the generation function 136.

With reference to FIG. 4, the sequence control circuitry 120 performs multi-frame acquisition while overlapping the FOV in the direction in which the blood flow is to be measured (i.e., in the first direction). In other words, the sequence control circuitry 120 performs multi-frame acquisition where the FOVs of at least two acquired frames are overlapped in the first direction. In the example illustrated in FIG. 4, if the downward direction from above is assumed to be the direction for measuring the blood flow, then the sequence control circuitry 120 performs multi-frame acquisition at different timings while shifting the FOV in the downward direction from above as illustrated by an FOV 10a, an FOV 10b, an FOV 10c, an FOV 10d, and an FOV 10e. Regarding the FOV 10a to the FOV 10e, the imaging is performed at mutually different timings. However, regarding the imaging positions, these FOVs overlap with each other by a certain ratio so that quasi time-series data can be generated therefrom. (explained later).

In other words, the sequence control circuitry 120 performs multi-frame acquisition while keeping the desired imaging region in common. Typically, the sequence control circuitry 120 performs multi-frame acquisition while overlapping 50% or more of the overall imaging region at neighboring timings. When the direction of the blood flow is downward from above with reference to FIG. 4; as explained with reference to FIGS. 3A and 3B, a large number of unsteady signals appear in regions 11a, 11b, 11c, 11d, and 11e representing the upstream side of the blood flow in the FOV. Hence, the signal value in those regions becomes greater than the signal value in the respective remaining regions.

Returning to the explanation with reference to FIG. 2, at Step S110, the processing circuitry 150 implements the generation function 136 so as to generate time-series data by integrating a plurality of sets of imaging data regarding a fixed slice position.

More particularly, with reference to FIG. 4, the processing circuitry 150 implements the generation function 136 so as to generate time-series data by integrating, regarding a slice 20 representing the fixed slice position, the following sets of data: data 13a representing the data regarding the slice 20 in the imaging of the FOV 10a; data 13b representing the data regarding the slice 20 in the imaging of the FOV 10b; data 13c representing the data regarding the slice 20 in the imaging of the FOV 10c; data 13d representing the data regarding the slice 20 in the imaging of the FOV 10d; and data 13e representing the data regarding the slice 20 in the imaging of the FOV 10e. That is, the processing circuitry 150 implements the generation function 136 so as to generate quasi time-series data based on multi-frame acquisition performed by the sequence control circuitry 120. Further, with reference to FIG. 4, although the FOV 10a to the FOV 10e are illustrated in a mutually nonoverlapping manner, it only indicates that the imaging timings are different; and, as far as the spatial imaging locations are concerned, the FOV 10a to the FOV 10e overlap with each other.

Herein, the signal value of the quasi time-series data generated as explained above can be treated as the sum of the contribution made by a plurality of flow rate components. Thus, the generated time-series data can be fit as the sum of a plurality of curved lines, so that the data of different flow rate components can be extracted.

Further, regarding the quasi time-series data, in the portion of the steady signals, the attenuation of the signal value is evident due to the steady application of the pulses having the flip angle FA at the TR interval; and, in the Portion of the unsteady signals, every time imaging is performed, it is estimated that the signal value that appears is related to the fluid that performs movement by the distance equal to the flow rate [m/s]×TR [s]. The sum of such signal values is believed to be measured as the quasi time-series data. Further, shorter the repetition time (TR) or greater the flip angle (FA), the more exponential is the decrease in the signal curve of the time-series data.

Returning to the explanation with reference to FIG. 2, at Step S120, the processing circuitry 150 decomposes the time-series data, which is generated at Step S110, into different flow rate components. In FIG. 5 is illustrated an example of the flow rate components obtained by decomposition according to the operation mentioned above. Herein, a graph 30a represents the graph of a fast flow rate component, a graph 30b represents the graph of a slow flow rate component, and the graph 30c is the graph of a stationary component. Along with the parameters such as the flip angle (FA) and the repetition time (TR), the curve shapes of the abovementioned graphs are dependent on the flow rate. Hence, by performing curve fitting with respect to the time-series data obtained at Step S110, the processing circuitry 150 can extract the flow rate components using the generation function 136.

In this way, the processing circuitry 150 implements the generation function 136 so as to estimate the flow rate of the fluid based on the quasi time-series data generated at Step S110. In other words, the processing circuitry 150 implements the generation function 136 so as to generate data regarding the components in the first direction of flow of the fluid based on multi-frame acquisition performed by the sequence control circuitry 120. Further, as a result of shifting the FOV, sometimes there occurs a change in the signal strength at the same position. In that case, the example explained above can be applied with respect to the signals that have been subjected to strength correction.

Further, the embodiment is not limited to the example explained above.

Alternatively, as an example, at Step S100, the sequence control circuitry 120 can acquire multiple frames by Performing a Stack-of-Stars acquisition or a Stack-of-Spirals acquisition. In the case of performing such acquisitions, breath holding is not required, and the imaging can be performed while allowing free breathing.

Moreover, at Step S100, the sequence control circuitry 120 can perform multi-frame acquisition according to various k-t imaging methods such as the k-t PCA method. Thus, at Step S100, as a result of implementing the k-t PCA method and performing imaging by appropriately thinning the k-space data, the sequence control circuitry 120 can perform multi-frame acquisition at a fast rate.

In this way, according to the embodiment, the contrast enhancement of the blood vessels can be achieved without having to use a contrast agent, and the flow rate too can be obtained. Moreover, in the embodiment in which, for example, a Stack-of-Stars acquisition is performed, images can be acquired without using an ECG since they can be acquired under free breathing. Furthermore, by varying the flip angle (FA) and the repetition time (TR) of the pulse sequence implemented by the sequence control circuitry 120, it becomes possible to visualize the flow rate of the blood flow in various ranges.

Further, the pulse sequence implemented by the sequence control circuitry 120 at Step S100 is not limited to the pulse sequence explained above. Alternatively, for example, it is possible to use a pulse sequence for generating a gradient echo while performing Cartesian sampling involving spoiler pulses, or it is possible to use the SSFP sequence (SSFP stands for Steady State Free Precession).

Moreover, at Step S100, the sequence control circuitry 120 can increase the imaging speed by performing simultaneous imaging of a plurality of slabs and by eliminating the aliasing on account of using a method for parallel imaging.

Further, the sequence control circuitry 120 can perform multi-frame acquisition by performing the operation at Step S100 with respect to a plurality of directions. The processing circuitry 150 implements the generation function 136 and synthesizes the data obtained regarding a plurality of directions. As a result, by implementing the generation function 136, the processing circuitry 150 can perform estimation of a higher degree of accuracy regarding the blood flow direction.

Moreover, according to the flow rate of the target fluid for imaging, the sequence control circuitry 120 can perform adjustment so that the parameters such as the flip angle (FA) and the TR (repetition time) of the pulse sequence to be implemented at Step S100 have the values suitable to the flow rate of the fluid.

According to at least one aspect of the embodiment described above, it becomes possible to visualize the blood flow.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
   sequence control circuitry configured to perform a multi-frame acquisition while spatially varying FOVs, wherein the FOVs (Field of Views) of at least two acquired frames are overlapped in a first direction; and
   processing circuitry configured to generate, based on the multi-frame acquisition performed by the sequence control circuitry, data regarding a component in the first direction of flow of a fluid, and control a display to display the generated data.

2. A magnetic resonance imaging method implemented by a magnetic resonance imaging apparatus, comprising:
   performing multi-frame acquisition while spatially varying FOVs, wherein the FOVs of at least two acquired frames are overlapped in a first direction;

generating, based on the multi-frame acquisition, data regarding a component in the first direction of flow of a fluid; and controlling a display to display the generated data.

3. A computer program product having a non-transitory computer readable medium including programmed instructions that when executed by a computer, cause the computer to perform a method comprising:

performing multi-frame acquisition while spatially varying FOVs, wherein the FOVs of at least two acquired frames are overlapped in a first direction;

generating, based on the multi-frame acquisition, generates data regarding a component in the first direction of flow of a fluid; and controlling a display to display the generated data.

4. The magnetic resonance imaging apparatus according to claim 1, wherein the sequence control circuitry is further configured to perform the multi-frame acquisition while overlapping 50% or more of entire imaging region at neighboring timings.

5. The magnetic resonance imaging apparatus according to claim 1, wherein the sequence control circuitry is further configured to perform the multi-frame acquisition while including a desired imaging region in common.

6. The magnetic resonance imaging apparatus according to claim 1, wherein, based on the multi-frame acquisition performed by the sequence control circuitry, the processing circuitry is further configured to generate quasi time-series data.

7. The magnetic resonance imaging apparatus according to claim 4, wherein, based on the quasi time-series data, the processing circuitry is further configured to estimate a flow rate of the fluid.

8. The magnetic resonance imaging apparatus according to claim 1, wherein the sequence control circuitry is further configured to perform the multi-frame acquisition according to a k-t PCA method.

9. The magnetic resonance imaging apparatus according to claim 1, wherein the sequence control circuitry is further configured to perform the multi-frame acquisition while performing a Stack-of-Stars acquisition.

* * * * *